(12) United States Patent
Hieser et al.

(10) Patent No.: US 11,867,743 B2
(45) Date of Patent: Jan. 9, 2024

(54) TEST DEVICE FOR ELECTRICAL LINES

(71) Applicant: ADAPTRONIC PRÜFTECHNIK GMBH, Wertheim (DE)

(72) Inventors: Hans-Peter Hieser, Wertheim (DE); Michael Haberkorn, Wertheim (DE)

(73) Assignee: ADAPTRONIC PRÜFTECHNIK GMBH, Wertheim (DE)

( * ) Notice: Subject to any disclaimer, the term of this patent is extended or adjusted under 35 U.S.C. 154(b) by 0 days.

(21) Appl. No.: 17/630,560

(22) PCT Filed: Jul. 24, 2020

(86) PCT No.: PCT/IB2020/057015
§ 371 (c)(1),
(2) Date: Jan. 27, 2022

(87) PCT Pub. No.: WO2021/019400
PCT Pub. Date: Feb. 4, 2021

(65) Prior Publication Data
US 2022/0291274 A1 Sep. 15, 2022

(30) Foreign Application Priority Data
Jul. 31, 2019 (EP) ..................................... 19189488

(51) Int. Cl.
*H01H 31/12* (2006.01)
*G01R 31/12* (2020.01)
(Continued)

(52) U.S. Cl.
CPC ......... *G01R 31/1272* (2013.01); *G01R 31/16* (2013.01); *G01R 31/2863* (2013.01); *G01R 31/2868* (2013.01); *G01R 31/67* (2020.01)

(58) Field of Classification Search
CPC .... G01R 31/12; G01R 31/1272; G01R 31/16; G01R 31/37; G01R 31/2863; G01R 31/2868; G01R 31/50
See application file for complete search history.

(56) References Cited

U.S. PATENT DOCUMENTS 4,859,953 A   8/1989  Young et al.
6,518,772 B1 *  2/2003  Milkovic ........... G01R 31/1272
                                                      324/536

(Continued)

FOREIGN PATENT DOCUMENTS

DE   100 24 809 A1   11/2001
FR   2 716 721 A1    9/1995

OTHER PUBLICATIONS

International Searching Authority, International Search Report issued for PCT/IB2020/057015 (dated Oct. 2, 2020).

(Continued)

*Primary Examiner* — Thang X Le
(74) *Attorney, Agent, or Firm* — Finch & Maloney PLLC

(57) ABSTRACT

The invention relates to a test device (1) for testing the insulation of an electrical line (2), in particular a cable or a cable harness, for detecting error points in the insulation of the electrical line (2). The test device (1) comprises a scalable, evacuable chamber (3) for completely accommodating the electrical line (2) to be tested, wherein at least one electrical connection point (6), preferably in the form of a plug device part, for connecting the electrical line (2) to be tested is arranged inside the chamber (3) and an electrical feedthrough (7) leads from the connection point (6) out of the chamber (3).

22 Claims, 4 Drawing Sheets

(51) Int. Cl.
   *G01R 31/67*    (2020.01)
   *G01R 31/16*    (2006.01)
   *G01R 31/28*    (2006.01)

(56) References Cited

U.S. PATENT DOCUMENTS

| | | | | |
|---|---|---|---|---|
| 6,571,606 | B2* | 6/2003 | Fleury | H01R 24/52 439/578 |
| 7,489,140 | B1* | 2/2009 | Butterworth | G01R 31/59 439/840 |
| 9,983,255 | B2* | 5/2018 | Ukwedeh | G01R 31/16 |
| 2015/0198649 | A1* | 7/2015 | Friedl | B65B 57/18 312/319.2 |
| 2017/0176387 | A1* | 6/2017 | Zhang | G01N 27/60 |

OTHER PUBLICATIONS

International Searching Authority, Written Opinion issued for PCT/IB2020/057015 (dated Oct. 2, 2020).

* cited by examiner

TEST DEVICE FOR ELECTRICAL LINES

RELATED APPLICATIONS

This application claims the benefit under 35 U.S.C. § 371 as a U.S. National Phase Application of PCT application no. PCT/IB2020/057015, filed on Jul. 24, 2020, and which claims priority to European Patent Application no. EP19189488.0, filed on Jul. 31, 2019, both of which are hereby incorporated herein by reference in their entireties.

FIELD OF THE DISCLOSURE

The invention relates to a test device for testing the insulation of an electrical line, in particular of a cable or of a cable harness, preferably for detecting error points in the insulation of the electrical line.

BACKGROUND

For many applications, cables are to be subjected to a test prior to the use thereof. The breakdown strength of the cable insulation represents an important criterion thereby. It is to be ruled out by means of such test methods that error points, which represent a hazard potential during the operation of electrical circuits in machines, vehicles, aircrafts, etc., are present in the insulation.

U.S. Pat. No. 4,859,953 discloses a test assembly for testing a preassembled cable harness. The test stand comprises a plurality of modular frame units comprising open ends, in order to be connected to one another. The length of the test stand can thus be changed, whereby different types of cable harnesses can be tested. However, this test assembly is not suitable to test the insulation of the cable harnesses or the breakdown strength of the cable insulation, respectively. The test also does not take place under vacuum conditions; the creation of a vacuum is not possible at all by means of the test assembly disclosed in U.S. Pat. No. 4,859,953.

DE10024809B4 discloses, for example, a means for detecting damages in the insulation of electrical lines and cable harnesses by means of a test chamber. The region of the line or of the cable harness to be detected is encompassed in a tong-like manner by a test vessel forming the test chamber. The test chamber is closed prior to the detection and the atmosphere thereof is replaced by a test gas or test gas mixture with a lower breakdown strength than that of air by means of gas exchange.

A disadvantage of this known solution is that the tong-like test vessel can only surround a portion of the cable. Moreover, the test chamber is not completely tight even in closed position, so that a test gas (mixture) has to be used in any case in order to prevent the penetration of air into the test chamber. It has become clear, however, that the detection of error points in a test gas atmosphere is not reliable. Due to the separate provision of a test gas, the effort is additionally very complex.

FR2716721 discloses a device for testing electrical cables. The device comprises a housing for accommodating an ionizing gas. The cable to be tested is thereby guided through holes in the housing, which are provided with sealing rings, so that always only one section of the cable is surrounded by the housing.

SUMMARY

It is thus the object of the present invention to create a device, which does not have the above-mentioned disadvantages, and which provides in particular for a quicker and more reliable procedure for testing electrical lines. The effort is to be as low as possible and the user-friendliness is to be high. Moreover, the optional possibility can be created of being able to conduct reliable tests even without the use of test gas.

The object is solved by means of the disclosed features. Advantageous further developments are specified in the figures and further disclosed in the detailed description.

According to the invention, the test device has a tightly closable, evacuable chamber for completely accommodating the electrical line to be tested, wherein at least one electrical connection point, preferably in the form of a connector part, for connecting the electrical line to be tested is arranged inside the chamber, and an electrical feedthrough leads from the connection point out of the chamber.

The chamber is tightly closable and evacuable, so that a vacuum, but at least a negative pressure, can be created inside the chamber. In other words, the inside of the chamber is closed to the outside in a vacuum-tight manner and/or can be evacuated, in the closed state of the chamber. The electrical feedthroughs from the connection point(s) to the outside are thereby formed in such a way that they ensure the tightness of the chamber. The connection points, which are preferably formed as connector part, can thereby form a flange in the wall feedthrough from the outside to the inside.

The breakdown strength of the cable insulation is tested by applying a test voltage (or a—time-variable—test voltage curve) between the electrical line and an electrode, which can be formed, for example, by the housing of the chamber or of a part of the housing of the chamber, respectively.

The advantage of the invention is to in particular be seen in that the electrical line to be tested is located in its entirety, i.e. including its ends, which can be fitted with plugs, inside the chamber during the test procedure. The test method can thus always be performed under the same conditions and independently of the form and size of the lines to be tested. The test can take place under vacuum, i.e. a test gas is not necessarily required. All of this makes the method simple, reproducible, and reliable. The cable, which is accommodated completely in the test chamber, can be connected to plugs, which are provided in a wall of the housing of the chamber.

A further advantage is that the test in its entirety takes place in a destruction-free manner.

It is preferred when the testing of the electrical line is performed under vacuum (i.e. with evacuated chamber). In the same way as in protective gas, the breakdown voltage is reduced by testing under vacuum. As a result, breakdowns occur at significantly lower voltage than at normal pressure.

The (high) voltage source required for the test can thereby be arranged outside the chamber. The electrical feedthroughs ensure the electrical connection from the outside to the inside of the chamber.

The invention is in particular a cable test device for testing and/or determining the breakdown strength of the cable insulation. In the present application, simple cables (i.e. without branchings), optionally with several lines running in parallel, as well as more or less complex cable structures or cable harnesses, respectively, are understood under the term cables. The present test device is suitable for all of them.

A preferred embodiment is characterized in that at least a portion, preferably at least half or at least the base, of the housing of the chamber is formed from conductive material, in particular metal, which is connected to a voltage source and/or a potential, preferably ground. The housing of the chamber is simultaneously used as electrode here in order to build up a voltage and to make the breakdown measurable in the case of an existing error point in the insulation. This preferably takes place by measuring the current. A measuring of the electrical field would likewise be conceivable. According to a further embodiment, the electric arc arising in the event of a breakdown from the error point in the insulation to the housing of the chamber could be detected or made visible, respectively, by means of an optical detection means, such as, e.g., a camera. In an alternative embodiment, an electrode could be arranged inside the chamber, e.g. in the form of a flat or plate-shaped electrode, which preferably serves as bearing surface for the line to be tested.

A preferred embodiment is characterized in that the test device comprises a measuring means for monitoring the electrical line. The measuring means can serve the purpose of monitoring or of controlling, respectively, the proper voltage application. Here, the goal is a control as to whether the test voltage does in fact arrive in the line to be tested. In the alternative or in addition, the measuring means can also serve the purpose of detecting a voltage drop due to a breakdown at an error point.

It is preferred when this measuring means is arranged outside the chamber and is connected to an electrical connection point inside the chamber. The measuring means can comprise, e.g., an amperemeter, a voltmeter, an electrical field meter and/or an optical detection means (such as, e.g., a camera), which is configured for optically detecting an electric arc escaping from the insulation.

A preferred embodiment is characterized in that at least two electrical connection points, preferably in each case in the form of a connector part, are arranged inside the chamber, wherein one of the connection points is connected to a voltage source (arranged outside the chamber), and another connection point is connected to the measuring means (arranged outside the chamber). An electrical line to be tested is connected with one of its ends to the voltage source via the one connection point, and with another end to the measuring means via the other connection point.

There can thus be two types of electrical connection points:
 a. one for feeding in the test voltage, optionally comprising switch-on means, which provides for the switch-on selectively to the connection points.
 b. another for measuring the voltage (checking whether the test voltage does in fact arrive in the line to be tested).

A preferred embodiment is characterized in that at least two, preferably at least five, electrical connection points, preferably in each case in the form of a connector part, are arranged inside the chamber, wherein an electrical feedthrough in each case preferably leads from the connection points out of the chamber, or wherein the connection points preferably have different forms. The greater the number of the connection points, the more lines can be tested in one cycle. Moreover, a greater number of connection points provides for the testing of complex cable harnesses comprising several plugs. In the case of differently dimensioned connection points, cables with different plug geometries can also be tested in a simple way.

In a preferred embodiment, the connection points are exchangeable, so that the test device can be adapted for different plug geometries.

A preferred embodiment is characterized in that at least two, preferably at least five, electrical connection points, preferably in each case in the form of a connector part, are anchored at a common support element, preferably in the form of a strip or plate, which can be removed from the housing of the chamber. The connection points (connector part) can preferably be removed individually from the common support element. This provides for a simple disassembly and a simple subsequent exchange of the connection points.

A preferred embodiment is characterized in that the at least one electrical connection point is anchored in or at an inner wall of the chamber.

A preferred embodiment is characterized in that the at least one electrical connection point is connected to a voltage source arranged outside the chamber via the electrical feedthrough.

A preferred embodiment is characterized in that the test device has a vacuum pump, which is connected to the chamber, for evacuating the chamber.

A preferred embodiment is characterized in that the chamber is formed by a trough-like part and a cover covering the trough-like part, wherein a seal is preferably provided between trough-like part and cover, which seal lies between the cover and the trough-like part in the closed state of the chamber. This embodiment ensures a high user-friendliness because the line to be tested has to only be placed into the trough and be connected to the connection points.

A preferred embodiment is characterized in that the at least one electrical connection point is arranged in a side wall of the trough-like part, wherein the side wall draws an obtuse angle with the base of the trough-like part inside the chamber, wherein the obtuse angle is preferably between 100° and 150°, preferably about 120°. Due to this measure, the connection points are directed exactly towards the operator, so that the connecting of the line can take place particularly easily.

A preferred embodiment is characterized in that the test device has a preferably displaceable frame supporting the chamber, wherein the chamber and the frame preferably form a table. In addition to the user-friendliness, the flexibility and the field of application of the test device are also increased here.

A preferred embodiment is characterized in that at least the trough-like part of the chamber forms an insert, which can be removed from the frame. The chamber as a whole can be replaced in this way.

A preferred embodiment is characterized in that the test device comprises a control means, which, comprising a user interface, is configured
 a. to provide for the parameterization of the test by an operator, in particular a parameter input, e.g. the height of the test voltage, the test duration, the pressure in the chamber, the reliable limit current (leakage current), etc.,
 b. to control the test sequence, and/or
 c. to document the test results (actual test conditions, reached current, voltage drop due to a breakdown, point in time of the breakdown, localization of the error point, etc.).

A preferred embodiment is characterized in that the frame supports at least one voltage source connected to the at least one electrical connection point and/or a vacuum pump connected to the chamber and/or a control means for controlling the test device and/or a user interface for operating the test device. A compact solution, which integrally includes all of the required components, is thus offered.

A preferred embodiment is characterized in that the test device has at least one sensor device for detecting and/or localizing a breakdown through the insulation of the electrical line to be tested, wherein the sensor device preferably comprises a measuring means connected to an electrical connection point, in particular an amperemeter or a voltmeter. The sensor device could, e.g., also comprise an image-capturing device, in particular a camera.

A preferred embodiment is characterized in that the chamber, preferably in its cover, has at least one viewing window (e.g. in the form of a bullseye) or at least one transparent section. The operator can thereby immediately recognize a breakdown, which arises in the form of an electric arc. The viewing window can optionally be used for demonstration purposes but is not absolutely necessary. In particular in the case of an optical evaluation, e.g. by means of a camara arranged inside the chamber, it would be preferred not to provide any viewing windows.

A preferred embodiment is characterized in that the cover is formed by means of a plate, which is preferably horizontally displaceable, and which forms a tabletop of the test device. A space-saving construction is attained thereby on the one hand; a height of the camera and of the cover thereof, which is ergonomically optimal for the operator, is attained on the other hand.

A preferred embodiment is characterized in that the cover can be displaced between closed and open position, preferably in a horizontal direction, wherein the cover is preferably guided by means of a guide, which is preferably mounted on roller bearings.

A preferred embodiment is characterized in that a seal for sealing the inside of the chamber with respect to the region outside the chamber is arranged in a region between the electrical connection point and a wall of the chamber. This ensures a vacuum-tight transition with simultaneous option for exchanging the connection point.

A preferred embodiment is characterized in that the at least one electrical connection point has a seal—preferably facing the inside of the chamber—in order to seal the inside of the chamber—in an air-tight and/or electrical manner—with respect to a space formed between the electrical connection point and a plug of the electrical line to be tested. The sealing function can thus be increased even further in the region of the connection point. This seal, however, can also be understood as electrical seal (i.e. as insulation), which prevents an electrical flashover to the electrical plugs of the connection points.

A preferred embodiment is characterized in that the at least one electrical connection point has a fixing mechanism, preferably a snap mechanism, for fixing a connector part of the electrical line to be tested at the connection point.

A preferred embodiment is characterized in that a spacer of electrically insulating material, preferably in the form of a grid or mesh or in the form of strips, for spacing apart an electrical line to be tested from the base of the chamber, is arranged on the base of the chamber.

The goal is also reached by means of a test method for testing the insulation of an electrical line, in particular of a cable or of a cable harness, preferably for detecting error points in the insulation of the electrical line, by means of a test device according to the invention, wherein the method comprises the steps of:
  a. introducing at least one electrical line to be tested into the chamber and connecting the electrical line to at least one electrical connection point of the chamber,
  b. evacuating the chamber, preferably until a pressure of less than 500 mbar, preferably of less than 200 mbar, particularly preferably of at least less than 100 mbar, is reached in the chamber,
  c. applying an electrical voltage between the electrical line to be tested and an electrode, which preferably forms at least one inner side of the chamber or is arranged inside the chamber, and/or between electrical lines to be tested.

A further step of the method comprises the—direct or indirect—monitoring of the electrical line to be tested by means of a sensor device (or measuring means, respectively). The breakdown strength of the insulation can thus be tested and/or a possible breakdown can be detected and/or one or several error points in the insulation can be found. The breakdown detection can take place, e.g., by evaluating the current with regard to exceeding of a threshold value, which can be set.

In the alterative or in addition, the electrical voltage can also be applied between two or several electrical lines to be tested. The measuring then takes place accordingly between the lines.

While the electrical voltage is applied, it is monitored by means of the sensor device, which can be connected—directly or indirectly—to the electrical line to be tested and/or to the electrode, whether a breakdown occurs or to what extent the electrical voltage drops, respectively. The sensor means in the form of an electrical measuring means can comprise, e.g., an amperemeter, a voltmeter and/or an electrical field meter. The sensor means could also be an optical detection means (such as, e.g., a camera) for detecting an electric arc escaping from the insulation.

A preferred embodiment is characterized in that the step of applying the electrical voltage and the step of monitoring the electrical line to be tested are performed when the chamber is evacuated (i.e. when negative pressure or vacuum, respectively, prevails in the chamber), preferably at a pressure in the chamber of less than 500 mbar, preferably of less than 200 mbar, particularly preferably of less than 100 mbar.

A preferred embodiment is characterized in that the applied electrical voltage is between 1 kV and 50 kV, preferably between 10 kV and 30 kV.

Further advantages, features, and details of the invention follow from the following description, in which exemplary embodiments of the invention are described with reference to the drawings.

The list of reference numerals as well as the technical content of the patent claims and figures is part of the disclosure. The figures are described cohesively and comprehensively. The same reference numerals mean the same components, reference numerals with different indices specify components, which are functionally identical or similar, whereby:

DETAILED DESCRIPTION

Figure 1:
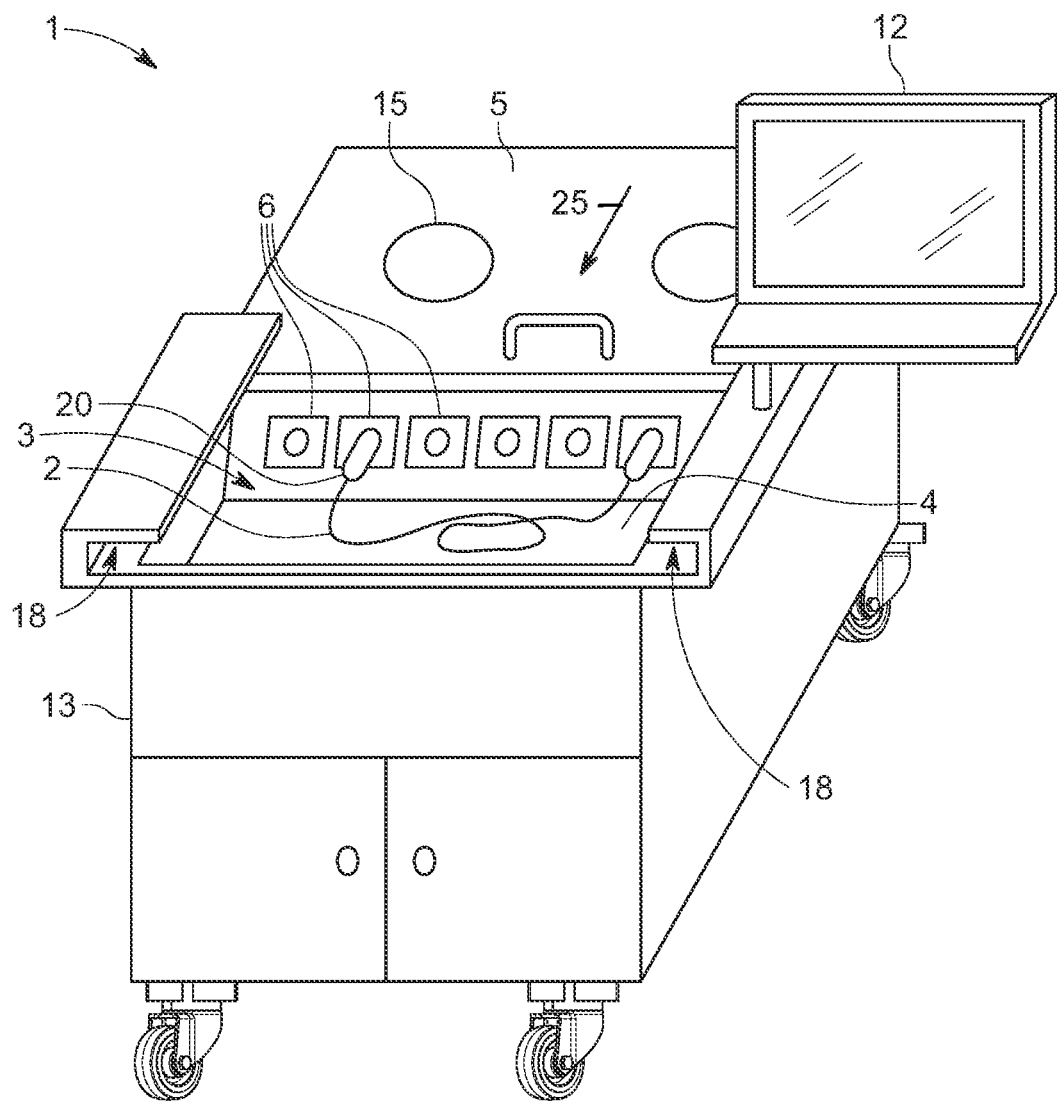
FIG. 1 shows an embodiment of a test device according to the invention.

FIG. 1 shows a test device 1 for testing the insulation of an electrical line 2, in particular of a cable or of a cable harness. In particular error points in the insulation of the electrical line 2 are detected thereby.

The test device 1 has a tightly closable, evacuable chamber 3 for completely accommodating the electrical line 2 to be tested. Several electrical connection points 6—here in the form of connector parts, such as connection plugs or connection sockets—for connecting the electrical line 2 to be tested are arranged inside the chamber 3. An electrical feedthrough 7 in each case leads from the connection points 6 out of the chamber 3 (FIGS. 2, 3, and 4), in order to connect the connection point 6 to a voltage source 8, which can be part of a measuring means.

In the closed state of the chamber 3, the inside of the chamber 3 is closed in a vacuum-tight manner to the outside and/or can be evacuated.

When applying a high voltage (after evacuation of the chamber), a voltage flashover to an electrode, which becomes visible as electric arc escaping from the cable, occurs in the region of the defect. The electrode is held at constant potential (e.g. ground). It is preferred when the housing or a housing part of the chamber 3 forms this electrode.

Figure 4:
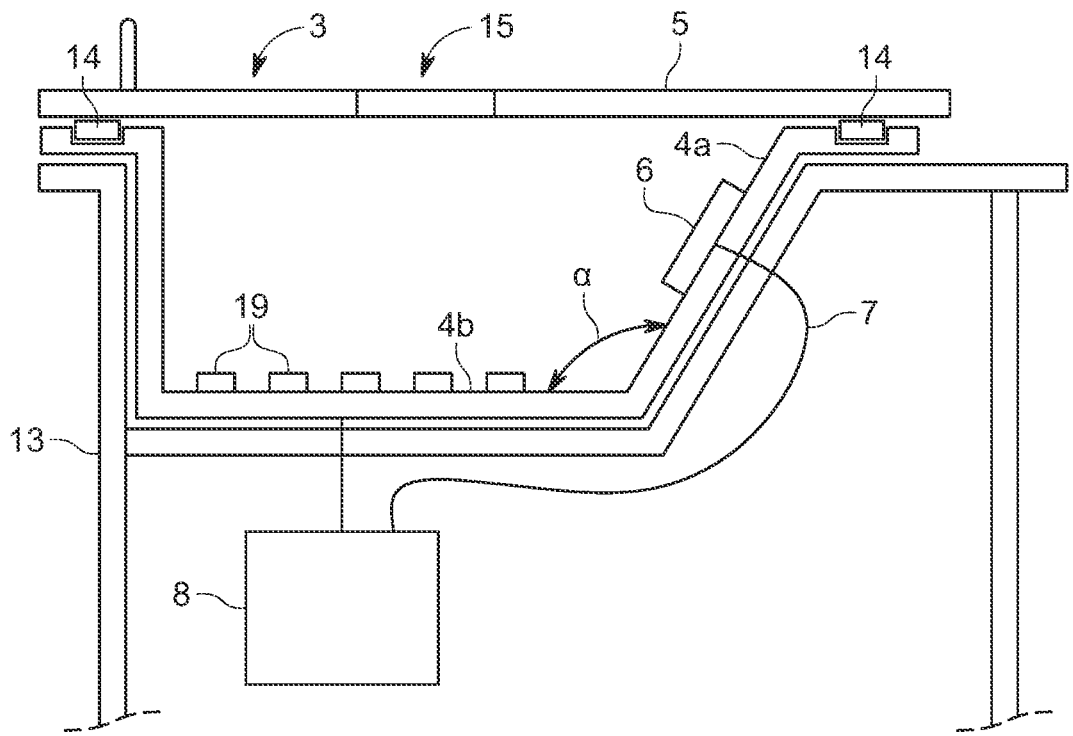
FIG. 4 shows the evacuable chamber in detail.

In the illustrated embodiment, at least a portion, preferably at least half or at least the base, of the housing of the chamber 3 is thus formed from conductive material, in particular metal, which is connected to a voltage source 8 and/or a potential, preferably ground (FIG. 4).

It would generally be possible to also provide only one connection point 6, but two or more are preferred, in order to be able to connect the lines to be tested on both ends or several lines simultaneously or complex cable harnesses to several connections. The individual connection points 6 can also have a different form.

Figure 2:
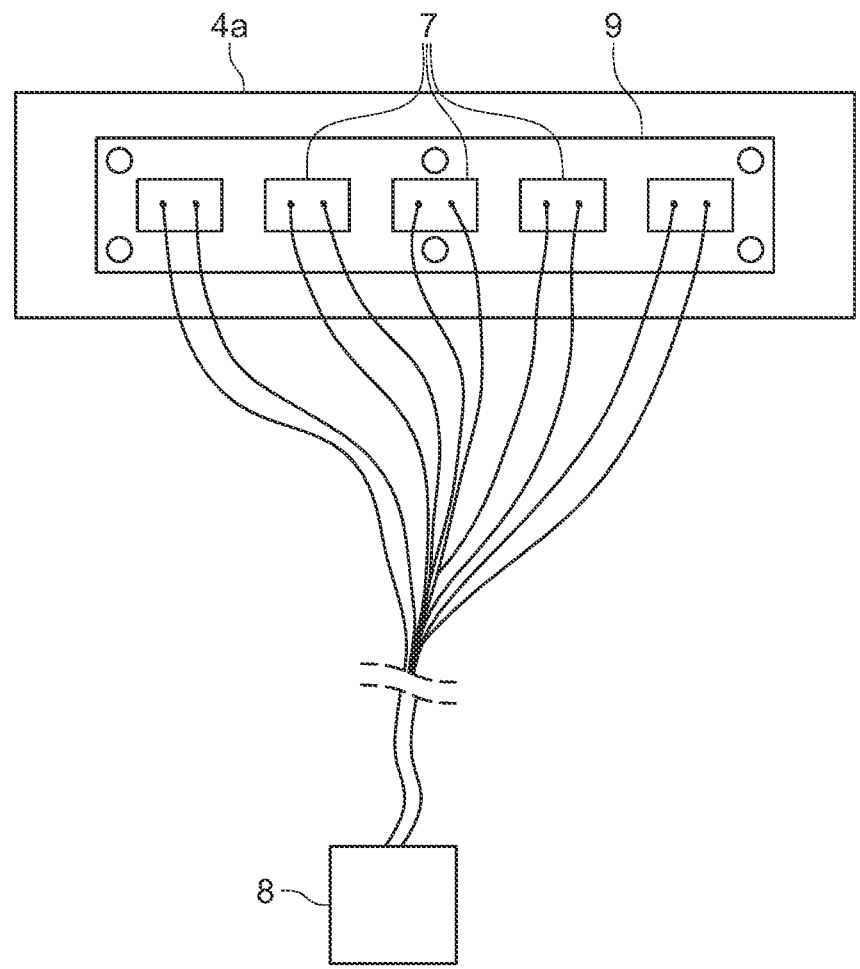
FIG. 2 shows the outside of a side wall of the chamber.

In the embodiment of FIG. 2, the electrical connection points 6 are anchored at a common support element 9, preferably in the form of a strip or plate, which can be removed from the housing of the chamber 3.

As can be seen from FIG. 1 and FIG. 4, the electrical connection point(s) 6 is/are anchored in or on an inner wall of the chamber 3.

Figure 5:
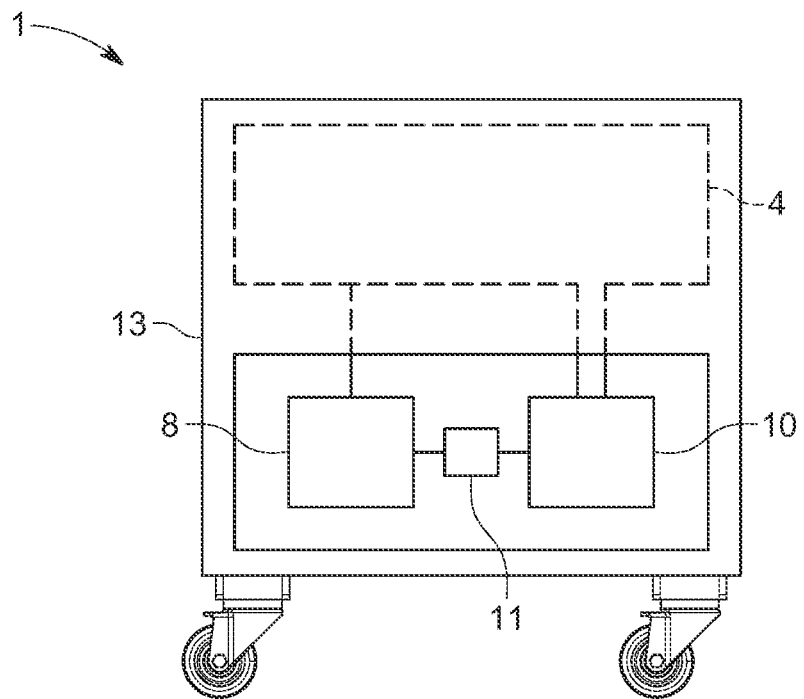
FIG. 5 shows the rear side of the test device with voltage source and vacuum pump.

It can be seen from FIG. 5 that the electrical connection point 6 is connected to a voltage source 8 arranged outside the chamber 3 via the electrical feedthrough 7. A vacuum pump 10 for evacuating the chamber 3 is also connected to the chamber 3.

The chamber 3 in FIG. 1 and FIG. 4 is formed by a trough-like part 4 and a cover 5 covering the trough-like part 4. A seal 14 can be provided between the trough-like part 4 and the cover 5, which seal lies between cover 5 and trough-like part 4 in the closed state of the chamber (FIG. 4).

It can further be seen from FIG. 4 that the electrical connection points 6 are arranged in a side wall 4a of the trough-like part 4. This side wall 4a draws an obtuse angle α with the base 4b of the trough-like part 4 inside the chamber 3. The obtuse angle α is preferably between 100° and 150° e.g. essentially 120°.

The test device 1—according to the preferred embodiment—has a—preferably displaceable (see rollers in FIGS. 1 and 5)—frame 13 supporting the chamber 3. The chamber 3 and the frame 13 can thereby form a table. At least the trough-like part 4 of the chamber 3 can be formed as an insert, which can be removed from the frame 13 (FIG. 4).

The frame 13 can support at least one voltage source 8 connected to the at least one electrical connection point 6 and/or a vacuum pump 10 connected to the chamber 3 and/or a control means 11 for controlling the test device 1 and/or a user interface 12 (e.g. a screen and/or a keyboard and/or touchscreen) for operating the test device 1.

It can be seen from FIG. 1 that the chamber 3—here: in its cover 5—can have at least one viewing window 15 or at least one transparent section.

The cover 5 of the chamber 3 is formed by means of a plate, which is preferably horizontally displaceable, and which forms a tabletop of the test device 1. The cover 5 can thus be capable of being displaced between closed and open position, preferably in a horizontal direction, such as indicated by arrow 25. In the embodiment of FIG. 1, the cover is guided by means of a guide 18, which is preferably mounted on roller bearings. In FIG. 1, this guide 18 is in each case arranged in the edge region of the table.

Figure 3:
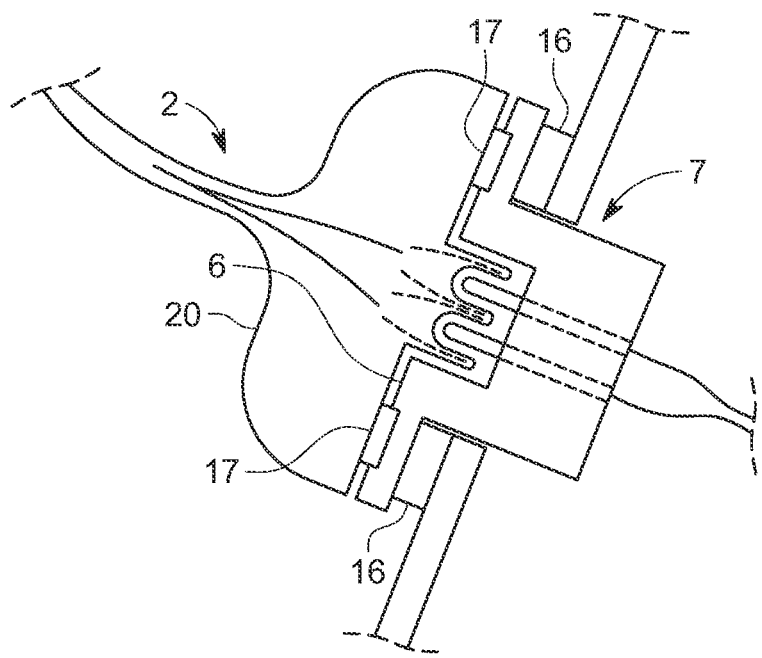
FIG. 3 shows an electrical connection point with connected electrical line in detail.

FIG. 3 shows a possible connection situation of a connection point 6 (here of a connection socket) and a connector part 20 of a line 2 to be tested. It can be seen that a seal 16 for sealing the inside of the chamber 3 with respect to the region outside the chamber 3 is arranged in a region between the electrical connection point 6 and a wall of the chamber 3.

The at least one electrical connection point 6 additionally has a seal 17 facing the inside of the chamber 3 or—when the line 2 is connected—the connector part 20, respectively, in order to seal the inside of the chamber 3 with respect to a space formed between the electrical connection point 6 and the connector part 20 when the electrical conductor 2 is connected.

The at least one electrical connection point 6 can also have a fixing mechanism, preferably a snap mechanism, for fixing a connector part 20 of the electrical line 2 to be tested at the connection point 6.

FIG. 4 shows a further preferred feature, namely a spacer 19 of electrically insulating material, preferably in the form of a grid or mesh or in the form of strips, arranged on the base 4b of the chamber for spacing apart an electrical line 2 to be tested from the base 4b of the chamber 3, which base 4b also forms the (counter) electrode here.

Figure 6:
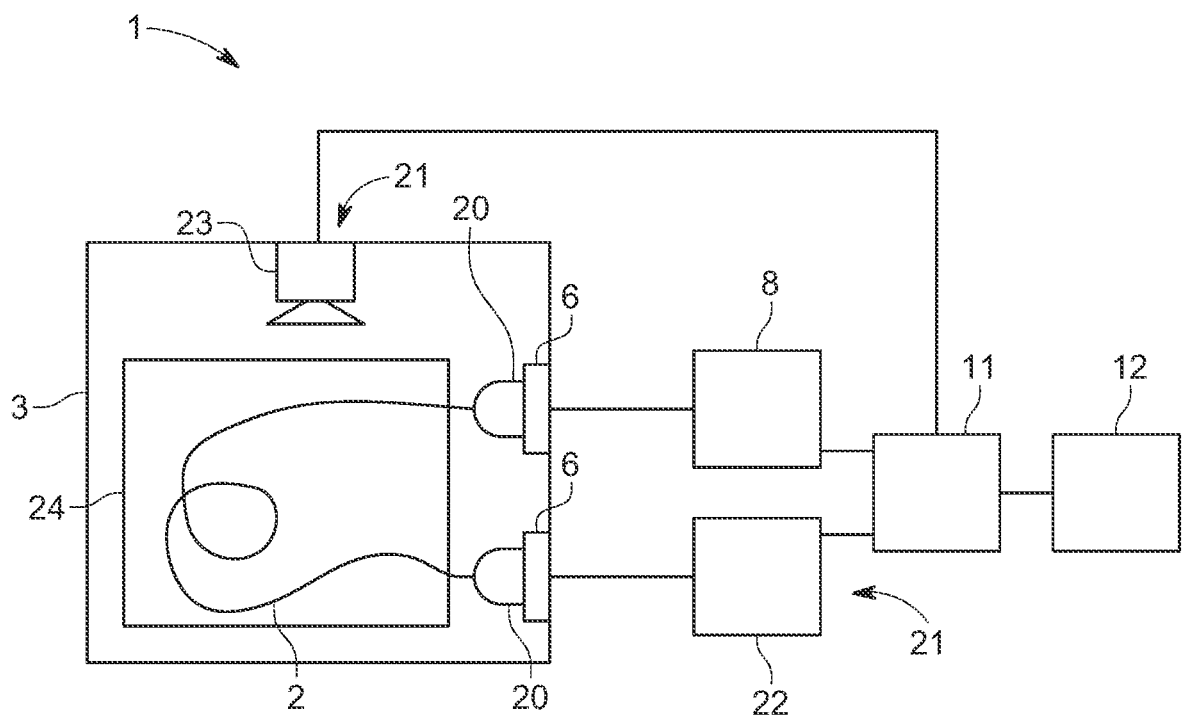
FIG. 6 shows an embodiment of the invention.

FIG. 6 shows a further embodiment of the invention comprising sensor devices 21 for detecting and/or localizing a breakdown through the insulation of the electrical line 2 to be tested and/or for monitoring or controlling, respectively, the applied electrical (test) voltage. An electrical measuring means 22 (e.g. an amperemeter and/or voltmeter) can be provided as sensor device outside the chamber 3 and/or an optical detection device 23 (e.g. a camera) can be provided inside the chamber 3.

As can be seen from FIG. 6, at least two electrical connection points 6 can be present inside the chamber 3, wherein one of the connection points 6 is connected to a voltage source 8 (arranged outside the chamber 3), and another connection point 6 is connected to the measuring means 22 (arranged outside the chamber 3). An electrical line 2 to be tested is connected with one of its ends to the voltage source 8 via the one connection point 6, and with another end to the measuring means 22 via the other connection point 6. It goes without saying that the measuring means 22, the voltage source 8, and optionally also the control means 11 can be integrated into a common structural unit.

The electrode 24 is illustrated separately in FIG. 6. As already mentioned several times, the housing of the chamber 3 itself can also form the counter electrode.

The sensor means 21—as well as the voltage source 8—are connected to the control means 11 and are controlled by the latter.

Finally, the invention also relates to a test method for testing the insulation of an electrical line 2, in particular of a cable or of a cable harness, preferably for detecting error points in the insulation of the electrical line 2, by means of a test device according to the invention. The method comprises the steps of:

a. introducing at least one electrical line 2 to be tested into the chamber 3 and connecting the electrical line 2 to at least one electrical connection point 6 of the chamber 3, b. evacuating the chamber 3 by means of a vacuum pump 10, preferably until a pressure of less than 500 mbar, preferably of less than 200 mbar, particularly preferably of less than 100 mbar, is reached in the chamber 3, c. applying an electrical voltage between the electrical line 2 to be tested and an inside of the chamber 3 and/or between electrical lines 2 to be tested.

While the electrical voltage is applied, it is monitored by means of the sensor means 21, which is connected—directly or indirectly—to the electrical line 2 to be tested and/or to the electrode 24, whether a breakdown occurs or to what extent the electrical voltage drops, respectively. The sensor means 21 can comprise, e.g., an amperemeter, a voltmeter, an electrical field meter and/or an optical detection means (such as, e.g., a camera) for detecting an electric arc escaping from the insulation.

A preferred embodiment is characterized in that the step of applying the electrical voltage and the step of monitoring the electrical line 2 are performed when the chamber 3 is evacuated (i.e. when negative pressure or vacuum, respectively, prevails in the chamber 3), preferably at a pressure in the chamber 3 of less than 50) mbar, preferably of less than 200 mbar, particularly preferably of less than 100 mbar.

The invention is not limited to the described and illustrated embodiments. It goes without saying that further designs are possible within the idea of the invention. Alternatives can in particular also refer to the constructive and functional design of the test device, preferably with regard to the user-friendliness and efficient and time-saving tests as well as the test procedure itself as well as the equipment and/or controls required for this purpose.

LIST OF REFERENCE NUMERALS

1 test device
2 electrical line to be tested
3 chamber
4 trough-like part
4a side wall of the trough-like part 4
4b base of the trough-like part 4
5 cover
6 electrical connection point
7 electrical feedthrough
8 voltage source
9 support element
10 vacuum pump
11 control means
12 user interface
13 frame
14 seal
15 viewing window
16 seal
17 seal
18 guide
19 spacer
20 connector part of the electrical line 2
21 sensor device
22 electrical measuring means
23 optical detection means
24 electrode

The invention claimed is:

1. A test device for testing the insulation of an electrical line, the test device comprising a chamber for completely accommodating an electrical line to be tested, wherein the chamber is sealingly closable and evacuable, so that a negative pressure can be created inside the chamber, and wherein at least one electrical connection point for connecting the electrical line to be tested is arranged inside the chamber, and an electrical feedthrough leads from the at least one electrical connection point out of the chamber, wherein the chamber is formed by a trough-like part and a cover covering the trough-like part, wherein a seal is provided between the trough-like part and the cover, which seal lies between cover and the trough-like part in a closed state of the chamber.

2. The test device according to claim 1, comprising a vacuum pump connected to the chamber, the vacuum pump configured to evacuate the chamber.

3. The test device according to claim 1, wherein the chamber defines the one or more electrical feedthroughs from the at least one electrical connection point to the outside, each of the one or more electrical feedthroughs configured to form a seal with the chamber.

4. The test device of claim 1, wherein at least a portion of the housing of the chamber is formed from conductive material that is connected to a ground.

5. The test device according to claim 1, wherein the at least one electrical connection point includes at least two electrical connection points, each of the at least two electrical connection points configured as a connector arranged inside the chamber, wherein the electrical feedthrough leads from the at least two connection points out of the chamber; and/or wherein the at least one electrical connection point includes at least two electrical connection points each of the at least two electrical connection points configured as a connector and anchored at a common support element in the form of a strip or plate configured to be removed from the housing of the chamber.

6. The test device according to claim 1, wherein the at least one electrical connection point is anchored in or at an inner wall of the chamber.

7. The test device according to claim 1, wherein the at least one electrical connection point is connected to a voltage source arranged outside the chamber via the electrical feedthrough.

8. The test device according to claim 1, wherein the at least one electrical connection point is arranged in a side wall of the trough-like part, wherein the side wall defines an obtuse angle with the base of the trough-like part inside the chamber, wherein the obtuse angle is between 100° and 150°.

9. The test device according to claim 1, wherein the test device has a displaceable frame supporting the chamber, wherein the chamber and the frame form a table.

10. The test device according to claim 9, wherein at least the trough-like part of the chamber forms an insert configured to be removed from the frame.

11. The test device according to claim 9, wherein the frame supports at least one voltage source connected to the at least one electrical connection point and/or a vacuum pump connected to the chamber and/or a control means for controlling the test device and/or a user interface for operating the test device.

12. The test device according to claim 1, wherein the cover, has at least one viewing window or at least one transparent section.

13. The test device according to claim 1, wherein the cover is formed by means of a plate configured to horizontally displaceable and which forms a tabletop of the test device.

14. The test device according to claim 1, wherein the cover can be displaced horizontally between a closed position and an open position, and wherein the cover is configured to be guided by means of a guide mounted on roller bearings.

15. The test device according to claim 1, comprising a seal for sealing the inside of the chamber with respect to the region outside the chamber, the seal arranged in a region between the at least one electrical connection point and a wall of the chamber.

16. The test device according to claim 1, wherein the at least one electrical connection point has a seal arranged to seal the inside of the chamber with respect to a space formed between the electrical connection point and a connector part of the electrical line to be tested when the electrical conductor is connected.

17. The test device according to claim 1, comprising at least one sensor device configured for detecting and/or localizing a breakdown through the insulation of the electrical line to be tested and/or configured for monitoring an electrical voltage applied to the electrical line to be tested, wherein the sensor device comprises an electrical measuring means connected to an electrical connection point or an optical detection means arranged inside the chamber.

18. The test device according to claim 1, wherein the at least one electrical connection point has a snap mechanism for fixing a connector part of the electrical line to be tested at the at least one connection point.

19. The test device according to claim 1, comprising a spacer of electrically insulating material in the form of a grid or mesh or in the form of strips, the spacer configured for spacing apart an electrical line to be tested from a base of the chamber and arranged on the base of the chamber.

20. A test method for detecting error points in the insulation of an electrical line, by means of a test device according to claim 1, the method comprising:
   introducing at least one electrical line to be tested into the chamber;
   connecting the electrical line to at least one electrical connection point of the chamber;
   evacuating the chamber until a pressure of less than 500 mbar is reached in the chamber; and
   applying an electrical voltage between the electrical line to be tested and an electrode arranged inside the chamber, and/or between the at least one electrical lines to be tested.

21. The test method according to claim 20, wherein the electrical line to be tested is located in its entirety inside the chamber during the test procedure.

22. The test method according to claim 20, further comprising determining a breakdown strength of the insulation of the at least electrical line to be tested.

* * * * *